United States Patent
Lin et al.

(10) Patent No.: US 6,852,576 B2
(45) Date of Patent: Feb. 8, 2005

(54) METHOD FOR FORMING STRUCTURES IN FINFET DEVICES

(75) Inventors: Ming-Ren Lin, Cupertino, CA (US); Haihong Wang, Milpitas, CA (US); Bin Yu, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/825,175

(22) Filed: Apr. 16, 2004

(65) Prior Publication Data

US 2004/0198031 A1 Oct. 7, 2004

Related U.S. Application Data

(62) Division of application No. 10/405,343, filed on Apr. 3, 2003, now Pat. No. 6,762,448.

(51) Int. Cl.[7] .............................................. H01L 21/84
(52) U.S. Cl. ....................................... 438/151; 438/283
(58) Field of Search ................................ 438/151, 154, 438/157, 283, 585, 588

(56) References Cited

U.S. PATENT DOCUMENTS

| | | | | |
|---|---|---|---|---|
| 4,996,574 A | 2/1991 | Shirasaki | .................... | 357/23.7 |
| 5,115,289 A | 5/1992 | Hisamoto et al. | .......... | 357/23.7 |
| 5,338,959 A | 8/1994 | Kim et al. | .................... | 257/331 |
| 5,545,586 A | 8/1996 | Koh | ............................ | 437/89 |
| 5,705,414 A | 1/1998 | Lustig | .......................... | 437/41 |
| 5,932,911 A | 8/1999 | Yue et al. | ..................... | 257/330 |
| 6,177,299 B1 | 1/2001 | Hsu et al. | .................... | 438/149 |
| 6,180,441 B1 | 1/2001 | Yue et al. | ..................... | 438/197 |
| 6,232,622 B1 | 5/2001 | Hamada | ...................... | 257/67 |
| 6,358,827 B1 | 3/2002 | Chen et al. | ................. | 438/585 |
| 6,413,802 B1 | 7/2002 | Hu et al. | ..................... | 438/151 |
| 6,492,212 B1 | 12/2002 | Ieong et al. | ................. | 438/157 |
| 6,514,819 B1 | 2/2003 | Choi | ........................... | 438/253 |
| 6,525,403 B2 | 2/2003 | Inaba et al. | .................. | 257/618 |
| 6,537,880 B1 | 3/2003 | Tseng | .......................... | 438/260 |
| 6,562,665 B1 | 5/2003 | Yu | ............................... | 438/149 |
| 6,583,469 B1 | 6/2003 | Fried et al. | .................. | 257/329 |
| 6,645,797 B1 | 11/2003 | Buynoski et al. | ........... | 438/157 |
| 6,657,259 B2 * | 12/2003 | Fried et al. | .................. | 257/350 |
| 6,716,686 B1 | 4/2004 | Buynoski et al. | ........... | 438/157 |
| 6,770,516 B2 * | 8/2004 | Wu et al. | .................... | 438/154 |
| 6,794,718 B2 * | 9/2004 | Nowak et al. | .............. | 257/347 |
| 2002/0011612 A1 | 1/2002 | Hieda | .......................... | 257/262 |
| 2002/0043690 A1 | 4/2002 | Doyle et al. | ................. | 257/368 |
| 2002/0060338 A1 | 5/2002 | Zhang | ......................... | 257/328 |
| 2003/0178677 A1 | 9/2003 | Clark et al. | | |
| 2004/0036126 A1 | 2/2004 | Chau et al. | .................. | 257/401 |
| 2004/0099885 A1 | 5/2004 | Yeo et al. | .................... | 257/208 |

FOREIGN PATENT DOCUMENTS

| | | |
|---|---|---|
| DE | 196 33 914 C1 | 8/1997 |
| EP | 1 202 335 A2 | 5/2002 |
| EP | 001383164 A1 * | 1/2004 ......... H01L/21/336 |

OTHER PUBLICATIONS

Digh Hisamoto et al., "FinFET—A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

(List continued on next page.)

Primary Examiner—David S. Blum
(74) Attorney, Agent, or Firm—Harrity & Snyder LLP

(57) ABSTRACT

A method forms fin structures for a semiconductor device. The method includes forming a first fin structure including a dielectric material and including a first side surface and a second side surface; forming a second fin structure adjacent the first side surface of the first fin structure; and forming a third fin structure adjacent the second side surface of the first fin structure. The second fin structure and the third fin structure are formed of a different material than the first fin structure.

20 Claims, 17 Drawing Sheets

OTHER PUBLICATIONS

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

Co–pending U.S. Appl. No. 10/726,569, filed Dec. 4, 2003, titled "Systems and Methods for Forming Multiple Fin Structures Using Metal–Induced–Crystallization," 23 pages.

Co–pending U.S. Appl. No. 10/754,515 and Preliminary Amendment, filed Jan. 12, 2004 titled "FinFET Device With Multiple Fin Structures.".

Co–pending U.S. Appl. No. 10/755,344 and Preliminary Amendment, filed Jan. 13, 2004 titled "FinFET Device With Multiple Channels.".

* cited by examiner

METHOD FOR FORMING STRUCTURES IN FINFET DEVICES

RELATED APPLICATION

This application is a divisional application of U.S. patent application Ser. No. 10/405,343, filed Apr. 3, 2003, now U.S. Pat. No. 6,762,448, which is incorporated herein by reference.

FIELD OF THE INVENTION

The present invention relates generally to semiconductor manufacturing and, more particularly, to forming FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may also be fabricated using layout and process techniques similar to those used for conventional planar MOSFETs.

SUMMARY OF THE INVENTION

Implementations consistent with the principles of the invention provide single-crystal silicon fin structures formed on opposite sides of a dielectric fin structure. The material for the dielectric fin structure is chosen such that a significant stress is induced in the single-crystal silicon material. Accordingly, enhanced mobility can be achieved.

In one implementation consistent with the principles of the invention, a method of manufacturing a semiconductor device that includes a substrate and a dielectric layer formed on the substrate is disclosed. The method includes etching the dielectric layer to form a first fin structure; depositing an amorphous silicon layer; etching the amorphous silicon layer to form a second fin structure adjacent a first side surface of the first fin structure and a third fin structure adjacent a second, opposite side surface of the first fin structure; depositing a metal layer on at least upper surfaces of the second fin structure and the third fin structure; performing a metal-induced crystallization operation to convert the amorphous silicon in the second and third fin structures to a single-crystal silicon material; forming a source region and a drain region; depositing a gate material over the first, second, and third fin structures; and patterning and etching the gate material to form at least one gate electrode.

In another implementation consistent with the present invention, a method for forming fin structures for a semiconductor device is provided. The method includes forming a first fin structure including a dielectric material and including a first side surface and a second side surface; forming a second fin structure adjacent the first side surface of the first fin structure; and forming a third fin structure adjacent the second side surface of the first fin structure, where the second fin structure and the third fin structure are formed of a different material than the first fin structure.

In yet another implementation consistent with the principles of the invention, a method for forming fin structures for a semiconductor device that includes a substrate and a dielectric layer formed on the substrate is provided. The method includes etching the dielectric layer to form a first fin structure; depositing an amorphous silicon layer; and etching the amorphous silicon layer to form a second fin structure adjacent a first side surface of the first fin structure and a third fin structure adjacent a second, opposite side surface of the first fin structure.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims their equivalents.

Implementations consistent with the principles of the invention provide single-crystal silicon fin structures that are formed on opposite sides of a dielectric fin structure. The material for the dielectric fin structure is chosen such that a significant stress is induced in the single-crystal silicon material to enhance mobility.

Exemplary Processing

Figure 1:
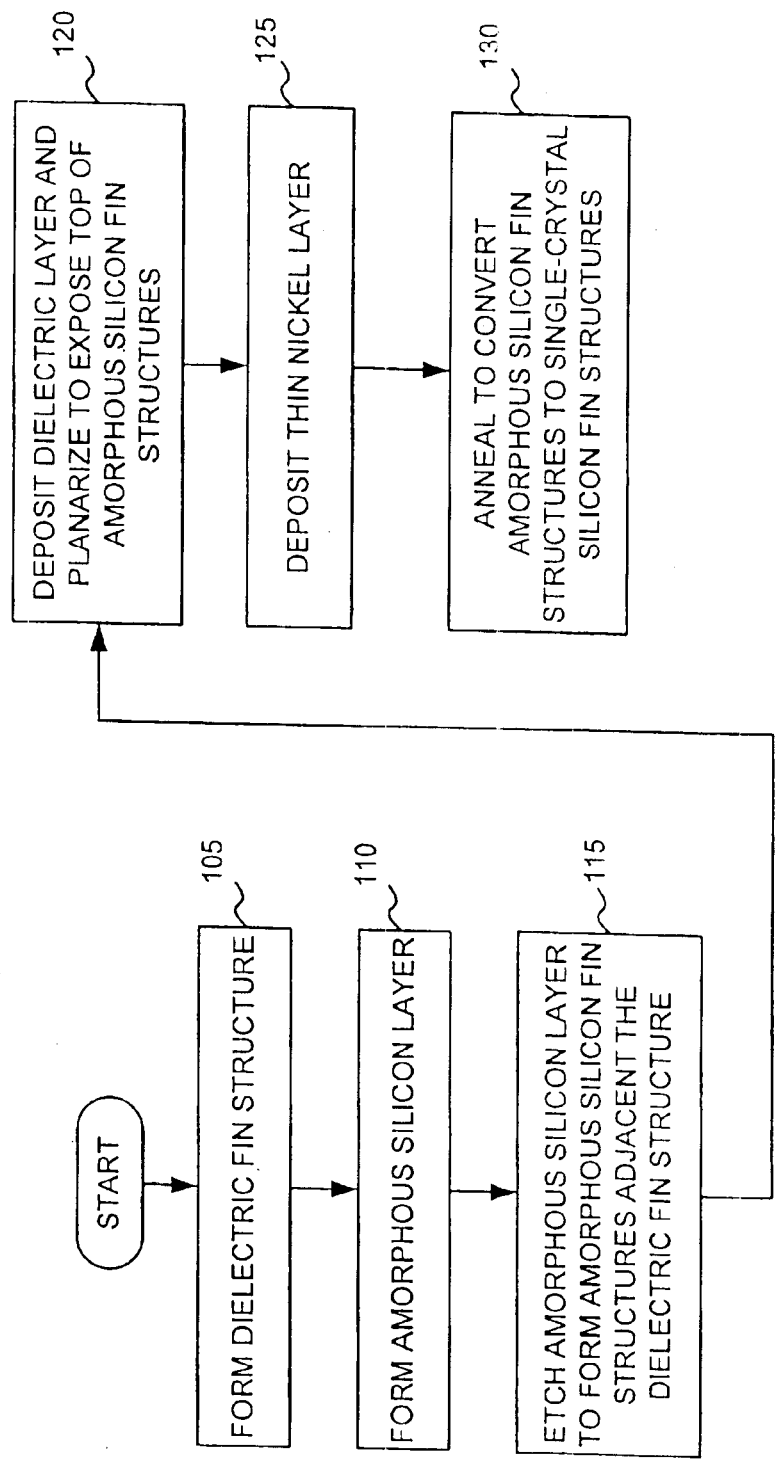
FIG. 1 illustrates an exemplary process for forming fin structures for a FinFET device in an implementation consistent with the principles of the invention.

FIG. 1 illustrates an exemplary process for forming fin structures for a FinFET device in an implementation consistent with the principles of the invention. FIGS. 2–9 illustrate exemplary views of a FinFET device fabricated according to the processing described in FIG. 1. The fabrication of one FinFET device will be described hereinafter. It will be appreciated, however, that the techniques described herein are equally applicable to forming more than one FinFET device.

Figure 2:
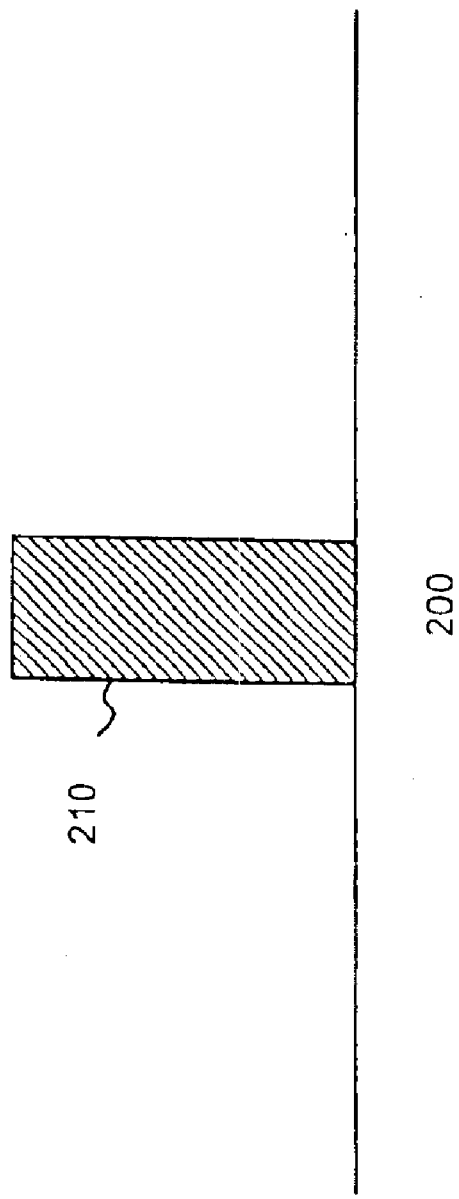
FIGS. 2–9 illustrate exemplary views of a FinFET device fabricated according to the processing described in FIG. 1.

With reference to FIGS. 1 and 2, processing may begin by forming a dielectric fin structure 210 on a substrate 200 of a semiconductor device (act 105). In one implementation, substrate 200 may comprise silicon. In alternative implementations consistent with the present invention, substrate 200 may comprise other semiconducting materials, such as germanium, or combinations of semiconducting materials, such as silicon-germanium. In another alternative, substrate 200 may include an insulator, such as an oxide layer, formed on a silicon or germanium substrate. Dielectric fin structure 210 may comprise a dielectric material that causes significant tensile stress (strain) in the dual fin structures that will be formed adjacent dielectric fin structure 210. In one implementation, dielectric fin structure 210 may comprise an oxide or a nitride.

Dielectric fin structure 210 may be formed in a conventional manner. For example, a dielectric material may be deposited over substrate 200 toga thickness ranging from about 200 Å to about 1000 Å. A mask may be formed over a portion of the dielectric material and the dielectric material may then be etched in a conventional manner, with the etching terminating on substrate 200 to form dielectric fin structure 210. The resulting dielectric fin structure 210 may have a width ranging from about 100 Å to about 1000 Å.

Figure 3:
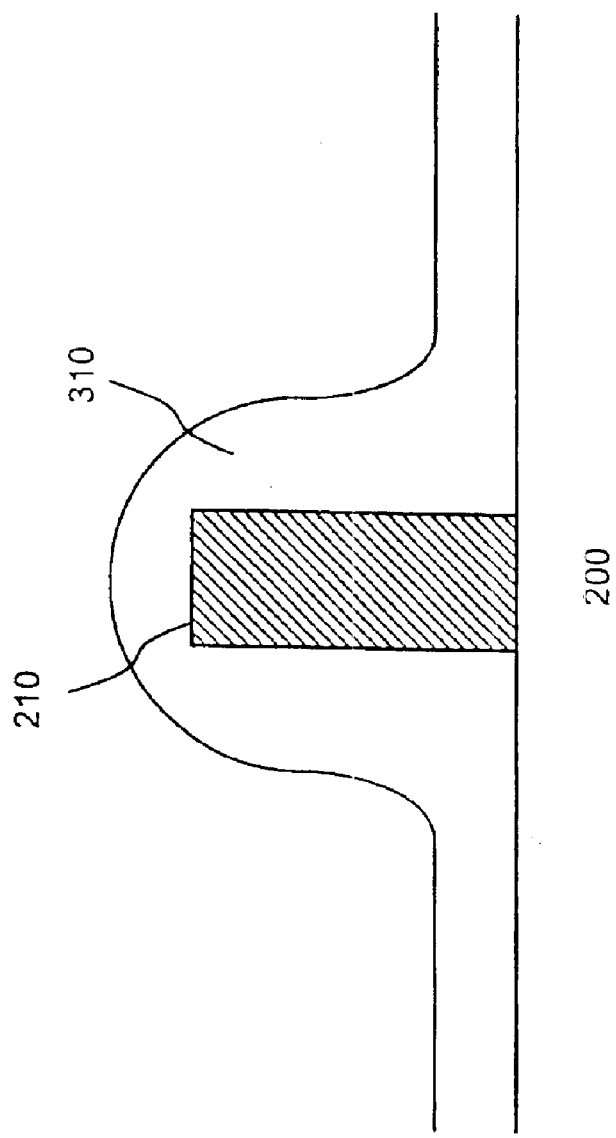

After forming dielectric fin structure 210, an amorphous silicon layer 310 may be deposited on the semiconductor device, as illustrated in FIG. 3 (act 110). In one implementation consistent with the principles of the invention, amorphous silicon layer 310 may be deposited to a thickness ranging from about 100 Å to about 1000 Å.

Figure 4:
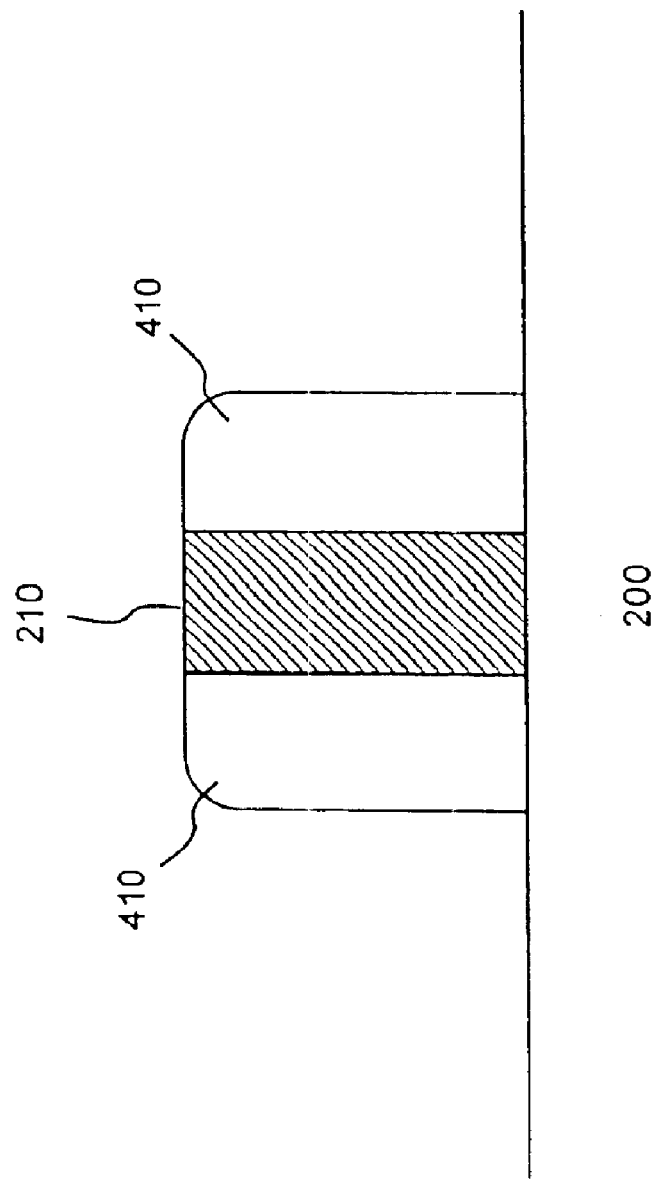

Amorphous silicon layer 310 may then be etched in a conventional manner, with the etching terminating at substrate 200 to form amorphous silicon spacer (fin) structures 410, as illustrated in FIG. 4 (act 115). Each amorphous silicon fin structure 410 may have a height ranging from about 200 Å to about 1000 Å and a width ranging from about 100 Å to about 1000 Å.

Figure 5:
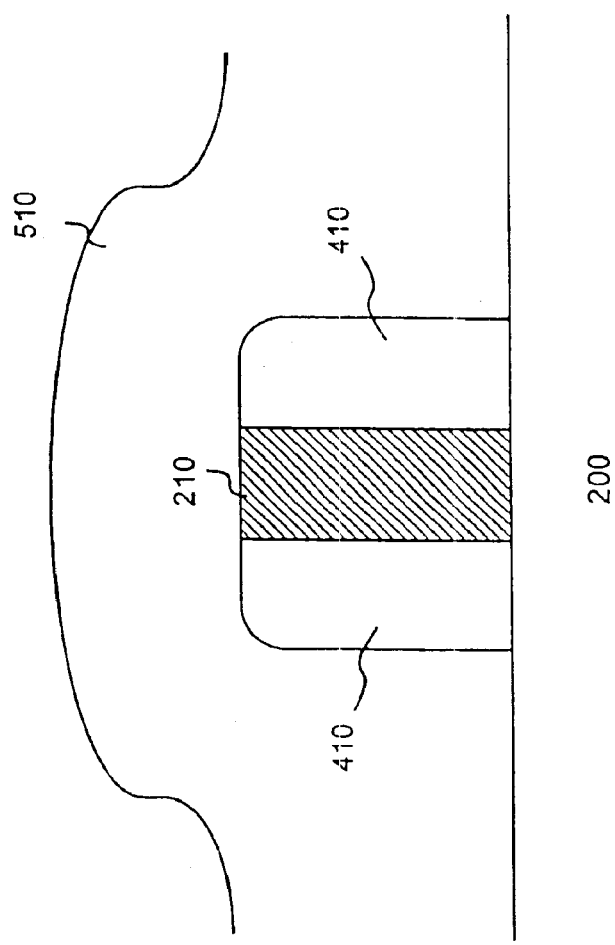

A dielectric layer 510 may be deposited on the semiconductor device, as illustrated in FIG. 5. (act 120). In one implementation consistent with the principles of the invention, dielectric layer 510 may be deposited to a thickness ranging from about 200 Å to about 1000 Å. Dielectric layer 510 may comprise an oxide or other dielectric materials.

Figure 6:
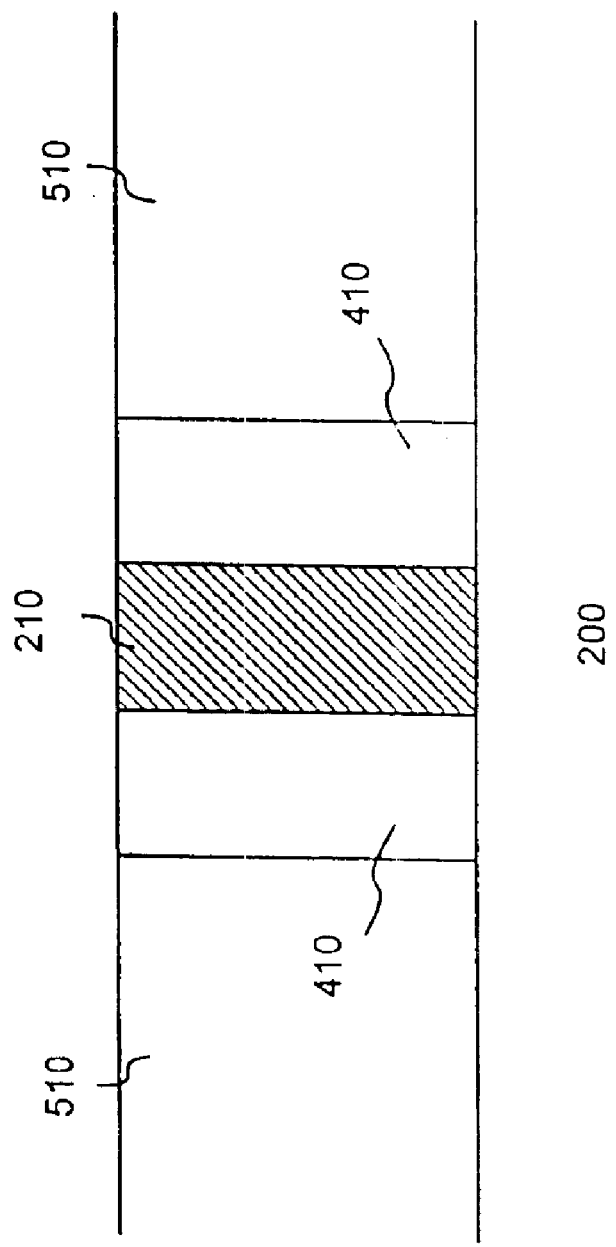

The semiconductor device may be polished via a chemical-mechanical polishing (CMP) (or other technique) to planarize the top surface of the semiconductor device such that the top surface of each of amorphous silicon fin structures 410 is exposed, as illustrated in FIG. 6 (act 120). During the CMP, a portion of the upper surface of dielectric fin structure 210 and amorphous silicon fin structures 410 may be removed so that the upper surface of each of amorphous silicon fin structures 410 is exposed. For example, after the CMP, the height of fins 210 and 410 may range from about 150 Å to about 200 Å.

Figure 7:
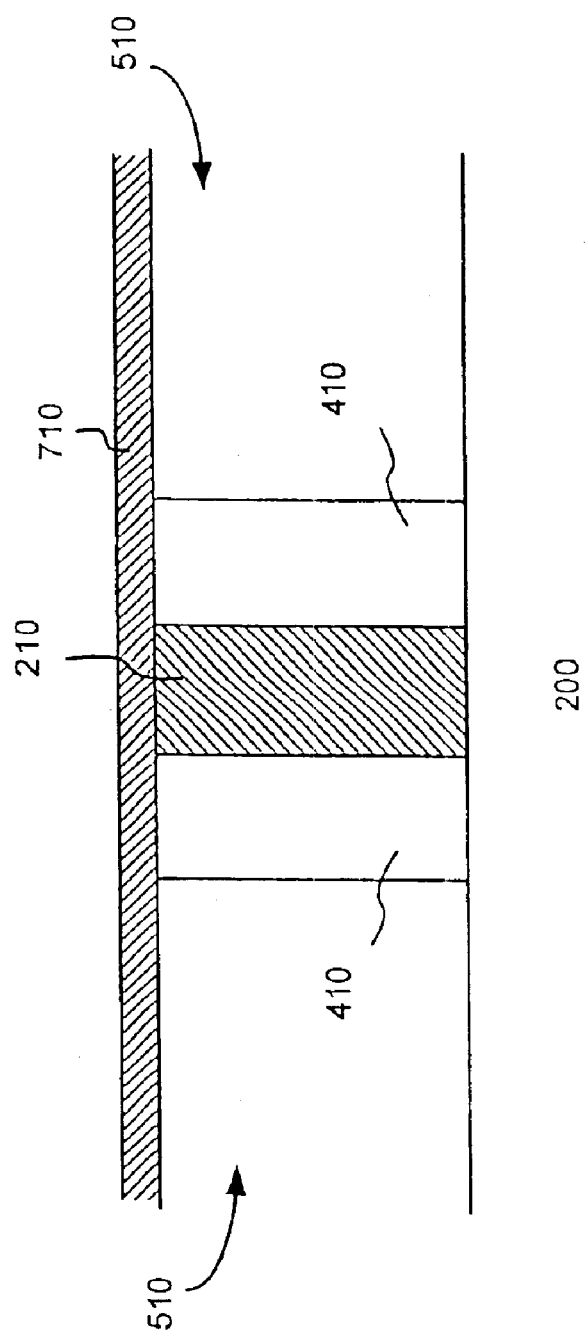

A metal layer 710, such as nickel, may be deposited on the semiconductor device, as illustrated in FIG. 7 (act 125). In one implementation, nickel layer 710 may be deposited to a thickness of about 20 Å.

Figure 8:
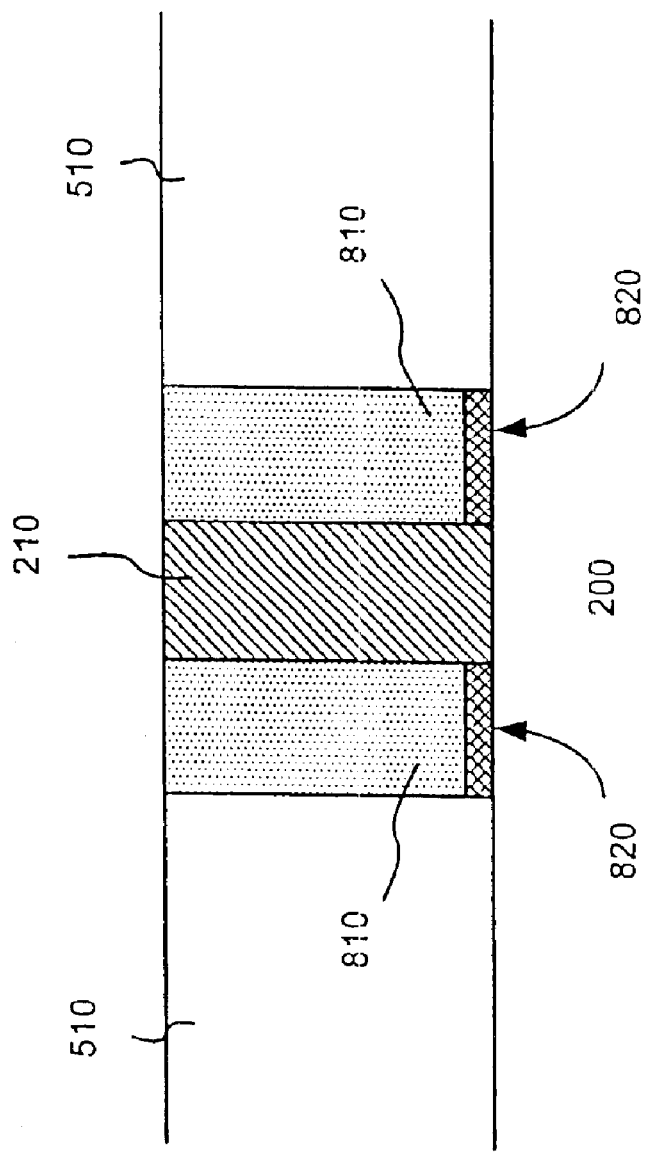

A metal-induced crystallization (MIC) operation may then be performed. The MIC operation may involve annealing nickel layer 710 at about 500° C. to about 550° C. for several hours, which acts to diffuse the nickel into the amorphous silicon to convert the amorphous silicon in fin structures 410 to single-crystal silicon 810, as illustrated in FIG. 8 (act 130). As a result of the MIC operation, a thin layer of a nickel silicon (NiSi) compound 820 may formed between substrate 200 and single-crystal silicon fin structures 810. In one implementation, the thickness of NiSi layer 820 may range from about 20 Å to about 200 Å.

Figure 9:
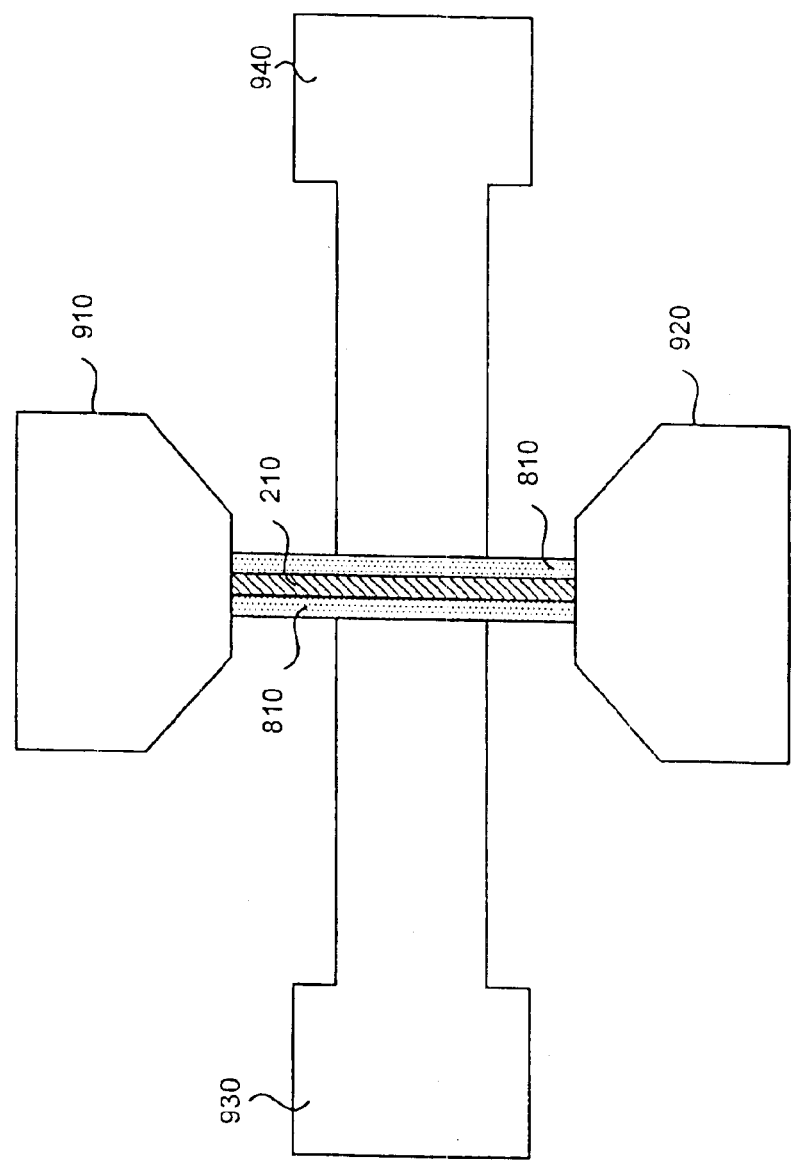

After single-crystal silicon fin structures 810 are formed, conventional FinFET fabrication processing can be utilized to complete the transistor (e.g., forming the source and drain regions), contacts, interconnects and inter-level dielectrics for the FinFET device. For example, dielectric layer 510 may be removed, a protective dielectric layer, such as a silicon nitride or silicon oxide may be formed on the top surface of fins 210 and 810, followed by the formation of a gate dielectric on the side surfaces of single-crystal silicon fin structures 810. Source/drain regions may then be formed at the respective ends of fins 210 and 810, followed by formation of one or more gates. For example, a silicon layer, germanium layer, combinations of silicon and germanium or various metals may be used as the gate material. The gate material may then be patterned and etched to form the gate electrodes. For example, FIG. 9 illustrates an exemplary top view of the semiconductor device consistent with the principles of the invention after the source/drain regions and gate electrodes are formed. As illustrated, the semiconductor device includes a double-gate structure with fins 210 and 810, source and drain regions 910 and 920, and gate electrodes 930 and 940.

Source/drain regions 910 and 920 may then be doped with n-type or p-type impurities based on the particular end device requirements. In addition, sidewall spacers may optionally be formed prior to the source/drain ion implantation to control the location of the source/drain junctions based on the particular circuit requirements. Activation annealing may then be performed to activate source/drain regions 910 and 920.

The present invention has been described above as forming a number of fin structures. It should be understood that methods consistent with the present invention may be used to form any number of fins, based on the particular circuit requirements.

Thus, in accordance with the principles of the invention, single-crystal silicon fin structures may be formed, having a dielectric fin structure located between the single-crystal silicon fin structures. The material for the dielectric fin structure may be chosen so as to induce a significant stress (strain) in the single-crystal silicon fin structures. As a result, enhanced mobility in the single-crystal silicon fin structures is achieved.

Other Implementations

Figure 10:
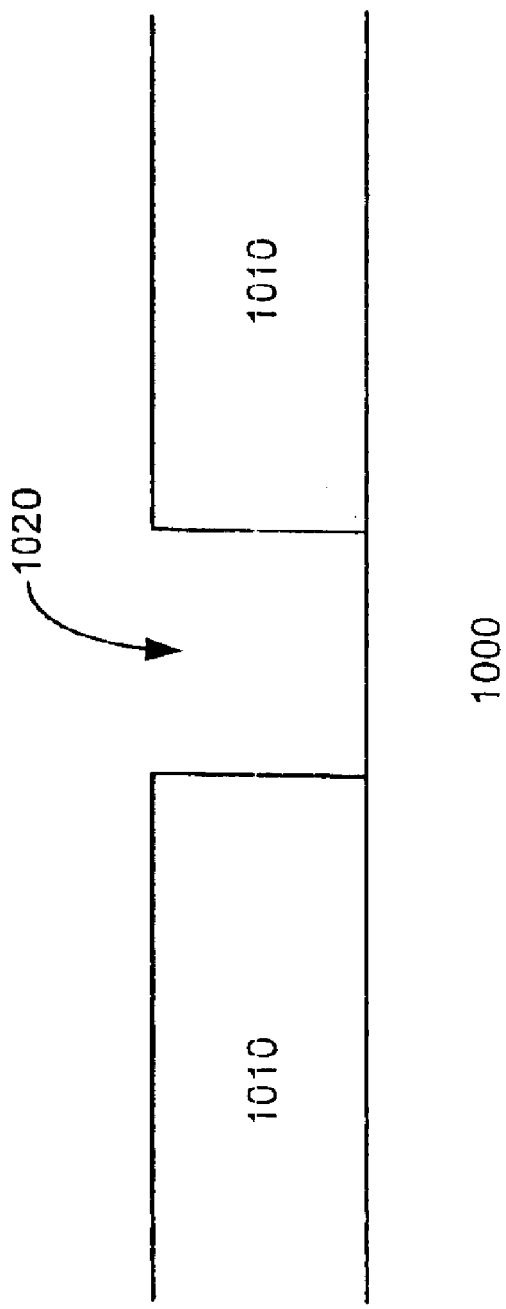
FIGS. 10–15 illustrate exemplary views for forming multiple fin structures in an alternative implementation consistent with the principles of the invention.

FIGS. 10–15 illustrate exemplary views for forming multiple fin structures in an alternative implementation consistent with the principles of the invention. With reference to FIG. 10, processing may begin with a semiconductor device that includes an oxide layer 1010 formed on a substrate 1000. Substrate 1000 may comprise silicon or other semiconducting materials, such as germanium, or combinations of semiconducting materials, such as silicon-germanium. Oxide layer 1010 may have a height ranging from about 200 Å to about 1000 Å.

Figure 11:
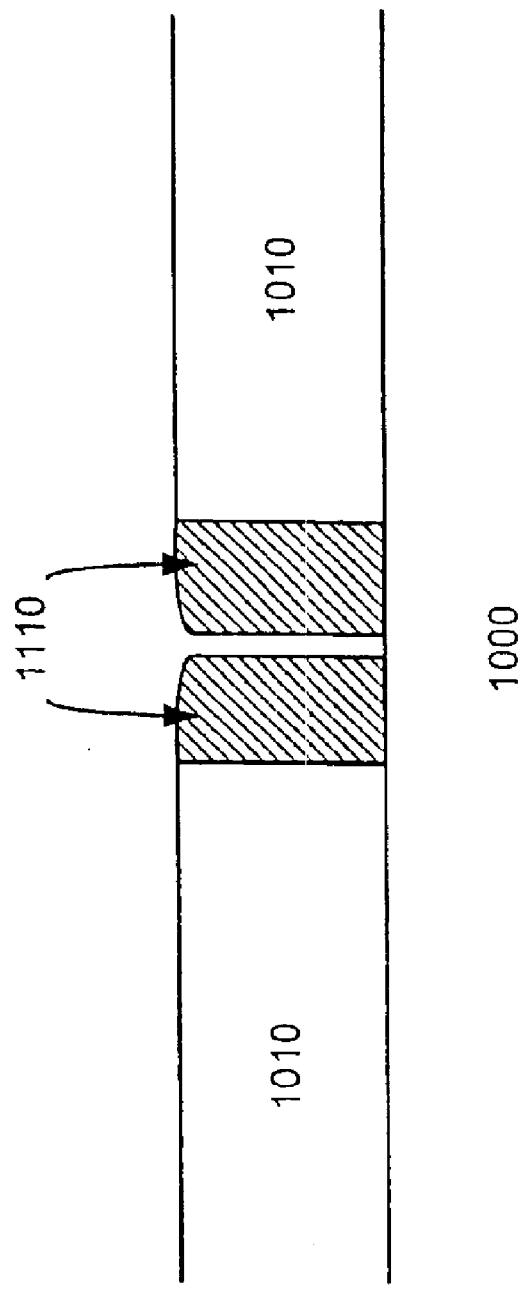
Figure 12:
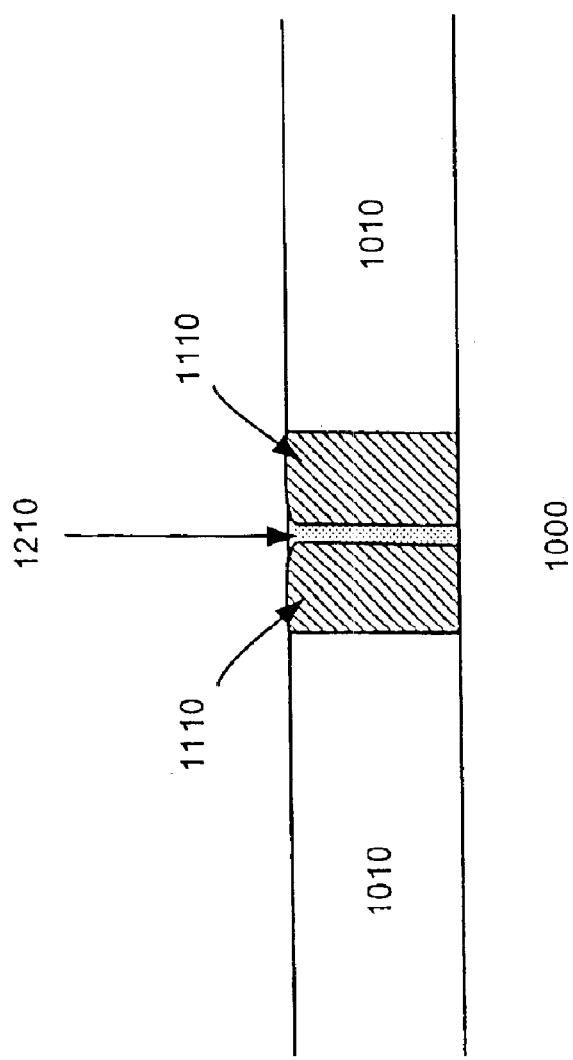

Oxide layer 1010 may be etched to form a trench 1020, as illustrated in FIG. 10. In one implementation, trench 1020 may have a width ranging from about 200 Å to about 2000 Å. Next, amorphous silicon may be deposited and etched to form amorphous silicon spacers 1110, as illustrated in FIG. 11. Each of amorphous silicon spacers 1110 may have a width ranging from about 100 Å to about 1000 Å. A dielectric material 1210 may be deposited in the gap between amorphous silicon spacers 1110, as illustrated in FIG. 12. The dielectric material may comprise an oxide or other dielectric materials.

Figure 13:
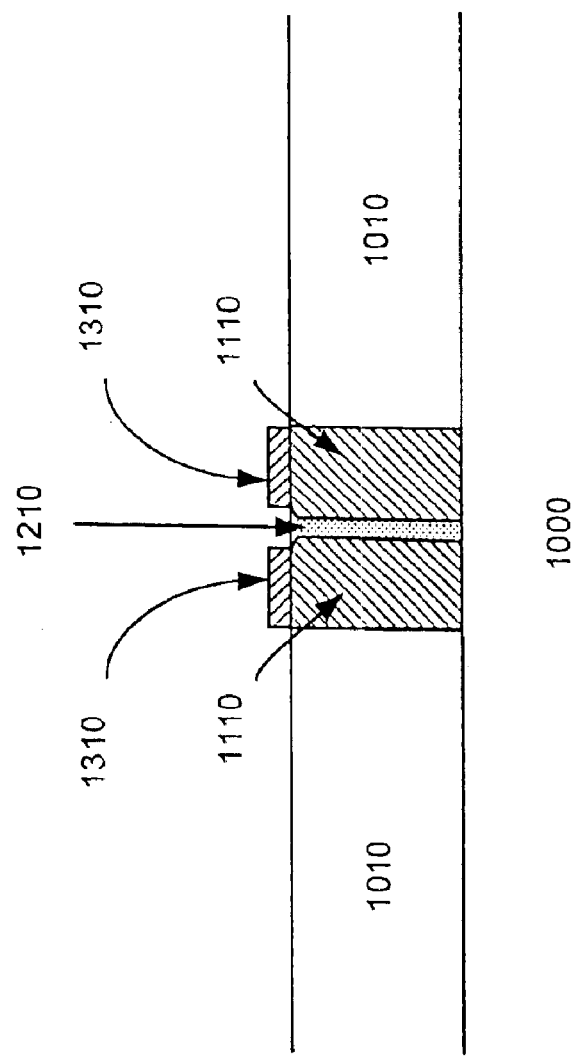
Figure 14:
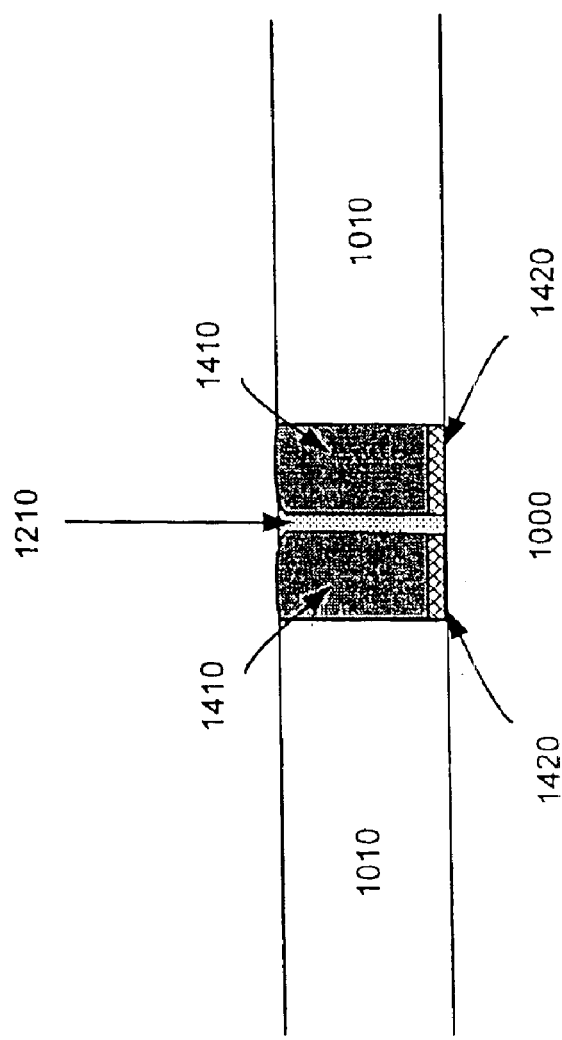

A layer of nickel 1310 may deposited on a top surface of amorphous silicon spacers 1110, as illustrated in FIG. 13. The thickness of nickel layer 1310 may be about 20 Å. A MIC operation may then be performed. The MIC operation may involve annealing nickel layer 1310 at about 500° C. to about 550° C. for several hours to convert amorphous silicon spacers 1110 to single-crystal silicon fin structures 1410, as illustrated in FIG. 14. As a result of the MIC operation, a thin layer of a nickel silicon (NiSi) compound 1420 may be formed between substrate 1000 and single-crystal silicon fin structures 1410. In one implementation, the thickness of NiSi layer 1420 may range from about 20 Å to about 200 Å.

Figure 15:
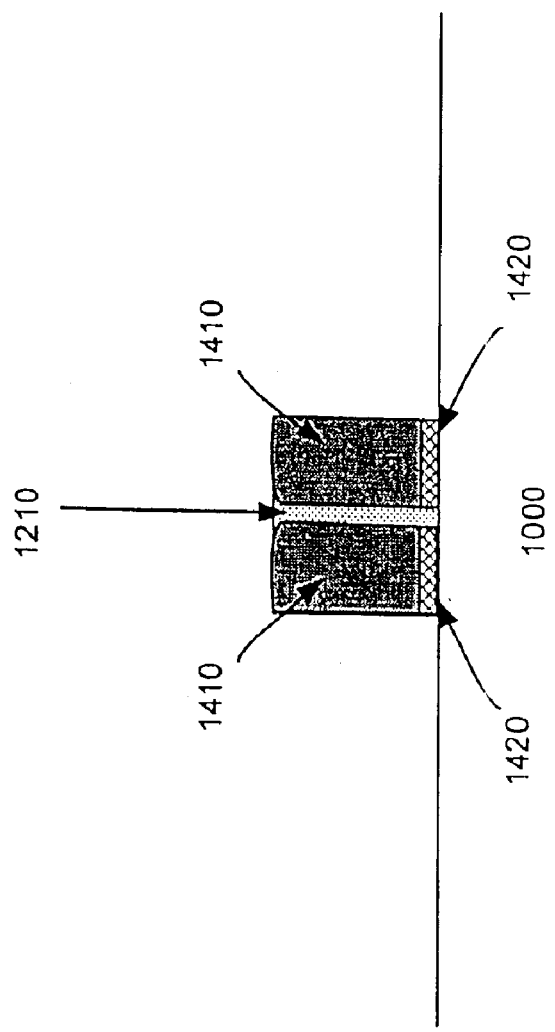

Oxide layer 1010 may then be removed in a conventional manner, as illustrated in FIG. 15. Accordingly, a spacer-induced merged FET can be produced.

Figure 16:
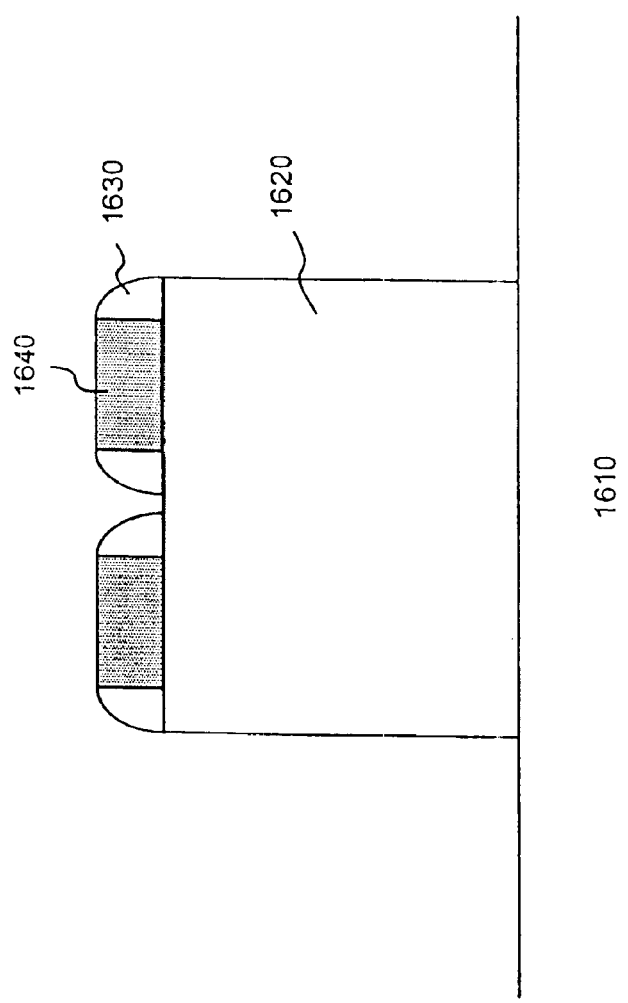
FIGS. 16 and 17 illustrate exemplary views for creating a trench according to an alternative implementation consistent with the principles of the invention.
Figure 17:
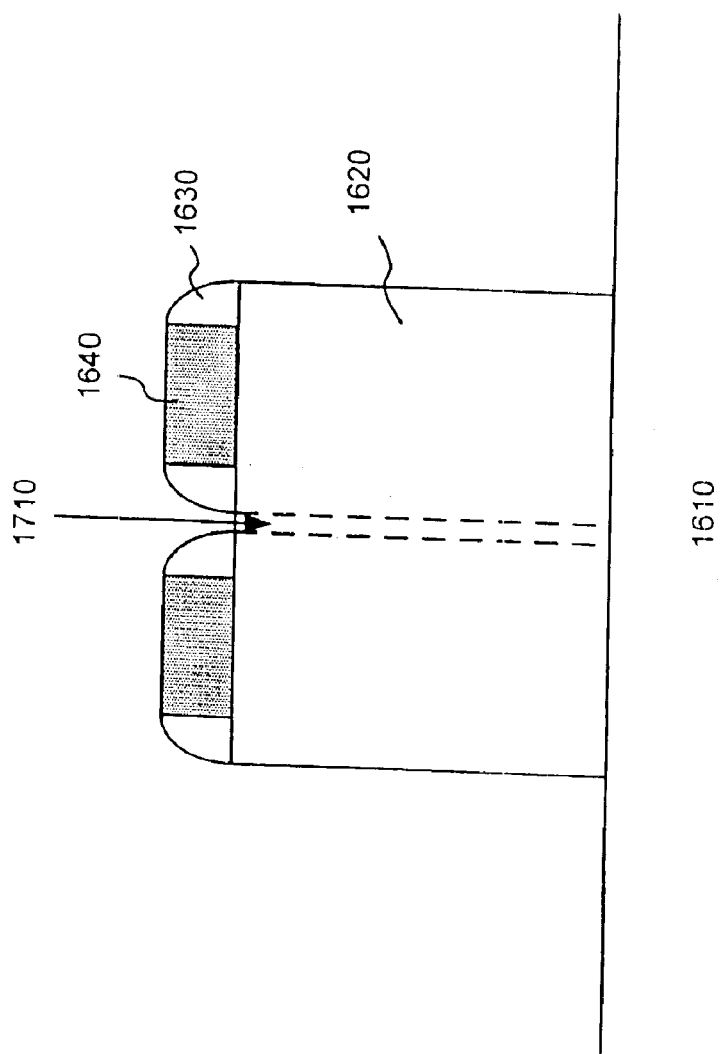

In another implementation, spacers may be used to create a narrow trench that can provide a coupling effect between both sides of the trench. As illustrated in FIG. 16, a semiconductor device may include an oxide layer 1610 formed on a substrate (not shown) with a silicon layer 1620 formed thereon. A material, such as a silicon nitride or a silicon oxide, may be deposited and patterned to form hard masks 1640. Next, a spacer material, such as SiN, SiO, or some other material, may be deposited and etched to form spacers 1630 on the side surfaces of hard masks 1640. Silicon layer 1620 may then be etched using spacers 1630 and hard masks 1640 as masks to form a narrow trench 1710, as illustrated in FIG. 17. Trench 1710 may have a width ranging from about 100 Å to about 1000 Å. Trench 1710 advantageously provides a coupling effect between fins 1620 located on both sides of trench 1710.

Conclusion

Implementations consistent with the principles of the invention provide single-crystal silicon fin structures that are formed on opposite sides of a dielectric fin structure. The material for the dielectric fin structure is chosen such that a significant stress is induced in the single-crystal silicon material. In this manner, enhanced mobility can be achieved.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A method of manufacturing a semiconductor device that includes a substrate and a dielectric layer formed on the substrate, the method comprising:

etching the dielectric layer to form a first fin structure;

depositing an amorphous silicon layer;

etching the amorphous silicon layer to form a second fin structure adjacent a first side surface of the first fin structure and a third fin structure adjacent a second, opposite side surface of the first fin structure;

depositing a metal layer on at least upper surfaces of the second fin structure and the third fin structure;

performing a metal-induced crystallization operation to convert the amorphous silicon in the second and third fin structures to a single-crystal silicon material;

forming a source region and a drain region;

depositing a gate material over the first, second, and third fin structures; and patterning and etching the gate material to form at least one gate electrode.

2. The method of claim 1 wherein a width of the first fin structure ranges from about 200 Å to about 1000 Å.

3. The method of claim 1 wherein the dielectric layer comprises at least an oxide or a nitride.

4. The method of claim 1 wherein a width of each of the second fin structure and the third fin structure ranges from about 100 Å to about 1000 Å.

5. The method of claim 1 further comprising:

forming a second dielectric layer prior to depositing the metal layer, and planarizing the second dielectric layer to expose upper surfaces of the second fin structure and the third fin structure.

6. The method of claim 1 wherein the performing a metal-induced crystallization operation forms a metal-silicon compound at a bottom surface of each of the second fin structure and the third fin structure.

7. The method of claim 6 wherein a thickness of the metal-silicon compound ranges from about 20 Å to about 200 Å.

8. The method of claim 1 wherein the depositing a metal layer includes:

depositing a nickel layer to a thickness of about 20 Å.

9. The method of claim 1 wherein the performing includes:

annealing the second fin structure and the third fin structure at a temperature of about 500° C. to about 550° C.

10. The method of claim 9 wherein the annealing is performed for at least two hours.

11. A method for forming fin structures for a semiconductor device, comprising:

forming a first fin structure comprising a dielectric material and including a first side surface and a second side surface;

forming a second fin structure adjacent the first side surface of the first fin structure; and forming a third fin structure adjacent the second side surface of the first fin structure, the second fin structure and the third fin structure being formed of a different material than the first fin structure.

12. The method of claim 11 wherein the forming a first fin structure includes:
    forming the first fin structure to a width ranging from about 200 Å to about 1000 Å.

13. The method of claim 11 wherein the dielectric material includes an oxide or a nitride.

14. The method of claim 11 wherein the forming a second fin structure includes:
    forming the second fin structure to a width ranging from about 100 Å to about 1000 Å, and
    wherein the forming the third fin structure includes:
        forming the third fin structure to a width ranging from about 100 Å to about 1000 Å.

15. The method of claim 11 wherein the forming the second fin structure and the third fin structure includes:
    depositing an amorphous silicon layer, and
    etching the amorphous silicon layer to form the second fin structure adjacent the first side surface of the first fin structure and the third fin structure adjacent the second side surface of the first fin structure.

16. The method of claim 15 further comprising:
    depositing a metal layer on at least upper surfaces of the second fin structure and the third fin structure; and
    performing a metal-induced crystallization operation to convert the amorphous silicon in the second and third fin structures to a single-crystal silicon material.

17. A method for forming fin structures for a semiconductor device that includes a substrate and a dielectric layer formed on the substrate, the method comprising:
    etching the dielectric layer to form a first fin structure;
    depositing an amorphous silicon layer; and
    etching the amorphous silicon layer to form a second fin structure adjacent a first side surface of the first fin structure and a third fin structure adjacent a second, opposite side surface of the first fin structure.

18. The method of claim 17 further comprising:
    depositing a metal layer on at least upper surfaces of the second fin structure and the third fin structure; and
    performing a metal-induced crystallization operation to convert the amorphous silicon in the second and third fin structures to a single-crystal silicon material.

19. The method of claim 17 wherein the etching the dielectric layer includes:
    forming the first fin structure to a width ranging from about 200 Å to about 1000 Å, and
    wherein the etching the amorphous silicon layer includes:
        forming the second fin structure to a width ranging from about 100 Å to about 1000 Å, and
        forming the third fin structure to a width ranging from about 100 Å to about 1000 Å.

20. The method of claim 17 wherein the dielectric material includes an oxide or a nitride.

* * * * *